United States Patent [19]

Dingwall

[11] Patent Number: 4,575,746
[45] Date of Patent: Mar. 11, 1986

[54] CROSSUNDERS FOR HIGH DENSITY SOS INTEGRATED CIRCUITS

[75] Inventor: Andrew G. F. Dingwall, Bridgewater, N.J.

[73] Assignee: RCA Corporation, Princeton, N.J.

[21] Appl. No.: 712,479

[22] Filed: Mar. 18, 1985

Related U.S. Application Data

[63] Continuation of Ser. No. 556,051, Nov. 28, 1983, abandoned, which is a continuation of Ser. No. 396,625, Jul. 9, 1982, abandoned, which is a continuation of Ser. No. 245,653, Mar. 20, 1981, abandoned, which is a continuation of Ser. No. 68,148, Aug. 20, 1979, abandoned.

[51] Int. Cl.$^4$ ................. H01L 27/12; H01L 27/02
[52] U.S. Cl. ........................... 357/49; 357/4; 357/42; 357/51; 357/91
[58] Field of Search ............... 357/4, 23.7, 42, 49, 357/91, 51

[56] References Cited

U.S. PATENT DOCUMENTS

| | | | |
|---|---|---|---|
| Re. 28,500 | 7/1975 | Bresee et al. | 357/22 |
| 3,283,221 | 11/1966 | Heiman | 357/23 |
| 3,443,176 | 5/1969 | Agusta et al. | 317/235 |
| 3,538,399 | 11/1970 | Bresee et al. | 357/22 |
| 3,597,287 | 8/1971 | Koepp | 357/22 |
| 3,943,555 | 3/1976 | Mueller et al. | 357/49 |
| 3,958,266 | 5/1976 | Athanas | 357/23 |
| 3,997,908 | 12/1976 | Schloetterer et al. | 357/22 |
| 4,021,835 | 5/1977 | Etoh et al. | 357/23 |
| 4,072,974 | 2/1978 | Ipri | 357/23 |
| 4,276,095 | 6/1981 | Beilstein et al. | 357/23 |

FOREIGN PATENT DOCUMENTS

| | | |
|---|---|---|
| 1037850 | 8/1966 | United Kingdom . |
| 1145879 | 3/1969 | United Kingdom . |
| 1261723 | 1/1972 | United Kingdom . |
| 1450171 | 9/1976 | United Kingdom . |
| 1459040 | 12/1976 | United Kingdom . |
| 1476192 | 6/1977 | United Kingdom . |
| 1603050 | 11/1981 | United Kingdom . |

Primary Examiner—Gene M. Munson
Attorney, Agent, or Firm—Birgit E. Morris; Donald S. Cohen

[57] ABSTRACT

A structure for a "universal crossunder" which can reliably interconnect two spaced regions of semiconductor material of the same conductivity type is described. The structure is comprised of two layers, one P type and the other N type which lies in the area between the regions which are to be electrically joined. Accordingly, whether the regions to be electrically connected are P type or N type, electrical connection is made between them through one of the layers of the crossunder.

The method of making the "universal crossunder" entails introducing a fast diffusing impurity of one conductivity type and a slow diffusing impurity of the opposite conductivity type into the area between the regions to be joined. Thus, electrical contact between the two spaced regions will be made through one or the other of the layers of the circuit.

6 Claims, 4 Drawing Figures

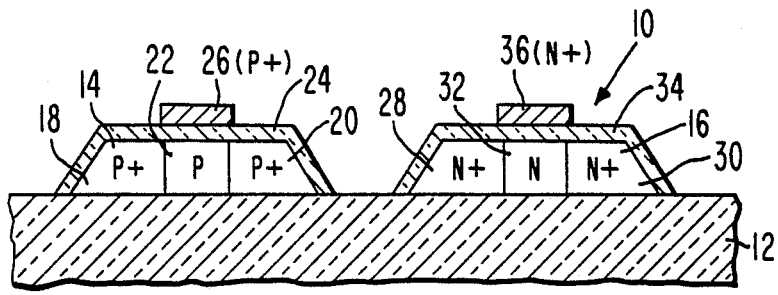
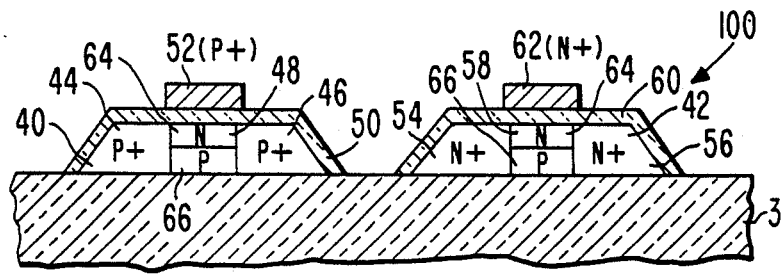
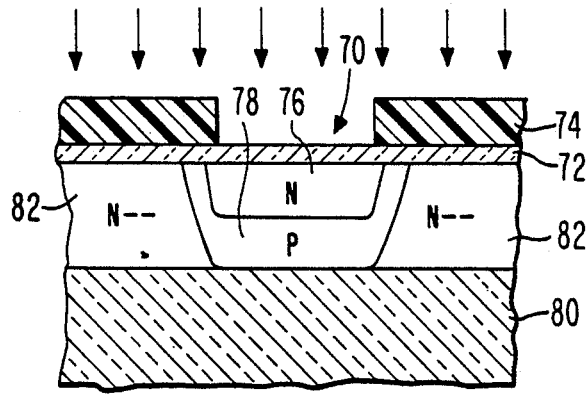
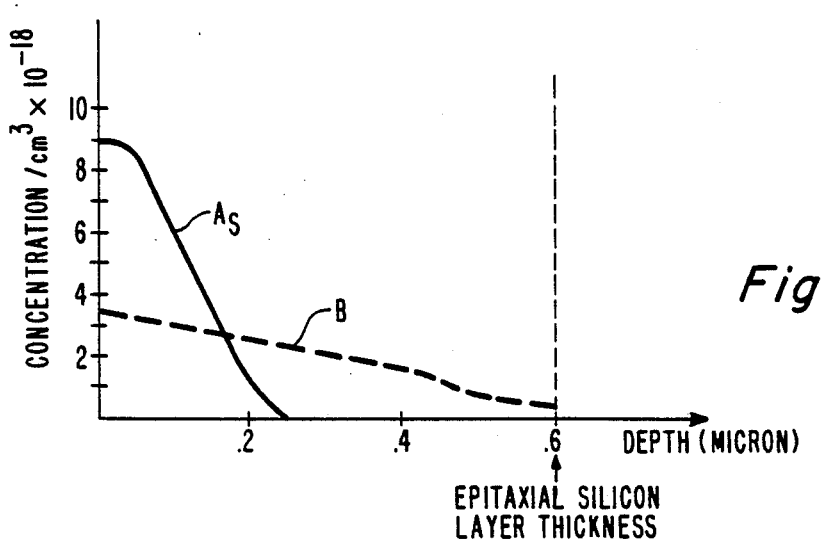

CROSSUNDERS FOR HIGH DENSITY SOS INTEGRATED CIRCUITS

This is a continuation of application Ser. No. 556,051, filed Nov. 28, 1983, now abandoned, which is a continuation of application Ser. No. 396,625, filed July 9, 1982 and now abandoned, which is a continuation of application Ser. No. 245,653, filed Mar. 20, 1981 and now abandoned, which is a continuation of application Ser. No. 068,148, filed Aug. 20, 1979 and now abandoned.

The present invention relates to integrated circuit devices. In particular, the invention relates to high density complementary symmetry metal oxide semiconductor (CMOS) devices, particularly those manufactured in the silicon-on-sapphire (SOS) technology.

In order to increase the packing density of devices in an integrated circuit, it is desirable to decrease the space required for interconnects between two or more devices. Heretofore, it has been necessary to utilize area consuming metal jumpers in order to interconnect two diffusions which are separated by an intervening gate line. Alternatively, doped epitaxial layers which run around the gate lines, thereby consuming considerable area, have also been used.

In self-aligned silicon gate CMOS processes, MOS action can occur between two diffusions which have a conductive line lying over them. Depending upon the conductivity type of the diffusions, and upon the type of conductive line overlying them, the diffusions may or may not be connected by MOS action. Typically, doped polycrystalline silicon gate lines are used in high density regions.

In order to reliably connect two diffusions which are separated by a doped polycrystalline silicon line with a low resistance ohmic path, an extra diffusion can be made prior to the deposition of the polycrystalline silicon line. Such a path would be independent of MOS action. The extra diffusion, which is located under the polycrystalline silicon line, is of the same conductivity type as the diffusions which it connects together. Since both P+ and N+ diffusions are used in CMOS integrated circuits, two additional masking steps, i.e. one for N+ diffusions and one for P+ diffusions, are required.

The present invention describes a method and structure for providing a unique "universal crossunder" which may be used to connect either P+ or N+ diffusions together and which requires only a single additional masking step.

IN THE DRAWINGS

FIG. 1 is a cross-sectional view of a portion of an integrated circuit structure of the prior art which does not include the universal crossunder structure of the present invention;

FIG. 2 is a cross-sectional view of a CMOS/SOS structure which includes the universal crossunder of the present invention;

FIG. 3 is a cross-sectional view of a portion of an integrated circuit structure showing the method of manufacturing the present invention; and FIG. 4 is a graph of the calculated profiles for boron and arsenic doses of the type used in the present invention.

Referring now to FIG. 1, a portion of an integrated circuit structure 10 of the prior art is shown. The integrated circuit structure 10 includes an insulating substrate 12 upon which semiconductor islands 14, 16 have been formed. Generally, the insulating substrate 12 is comprised of sapphire and the semiconductor islands 14, 16 are comprised of silicon in the well-known SOS technology. The island 14 is shown to include a pair of P+ diffusions 18, 20 which are separated by a P type region 22. A silicon dioxide layer 24 overlies the island 14 and a P+ doped polycrystalline silicon line 26 overlies the silicon dioxide layer 24. The purpose of the P type region is to provide a conductive path between the P+ regions 18, 20.

Similarly, the silicon island 16 comprises a pair of separated N+ regions 28, 30 having an N type region 32 lying therebetween. A silicon dioxide layer 34 overlies the island 16 and an N+ type polycrystalline silicon line 36 overlies the silicon dioxide layer 34. The purpose of the N type region 32 is to provide a reliable conductive path between the N+ regions 28, 30.

Typically, the integrated circuit 10 is manufactured using a self-aligned technique in which the polycrystalline silicon line 26 is doped to P+ type conductivity by ion implanatation at the same time that the P+ regions 18 and 20 are doped to a P+ conductivity. Similarly, the N+ doped polycrystalline silicon line 36 is doped in the same ion implantation step that dopes the regions 28, 30 to N+ conductivity. Therefore, it has been necessary to dope the P type region 22 and the N type region 32 in separate steps which each required separate photomasks.

In view of the fact that the yield in a semiconductor manufacturing process declines as the number of processing steps increases, the elimination of a photomask step is highly desirable. Accordingly, the present invention is desirable in that it eliminates at least one photomask step in the fabrication of the "universal crossunder" which is the subject of the present invention.

Referring now to FIG. 2, a portion of a semiconductor integrated circuit 100 employing the present invention is shown. The integrated circuit structure 100 comprises an insulating substrate 38 upon which single crystal semiconductor islands 40, 42 are formed. In the preferred embodiment of the invention, the insulating substrate 38 is comprised of sapphire and the semiconductor islands 40, 42 are comprised of silicon. The semiconductor island 40 comprises a pair of P+ regions 44, 46 with a universal crossunder 48 lying therebetween. Overlying the island 40 is a silicon dioxide layer 50. A P+ doped polycrystalline silicon line 52 overlies the silicon dioxide layer 50 over the universal crossunder 48. Similarly, the semiconductor island 42 comprises a pair of N+ regions 54, 56 having a universal crossunder 58 lying therebetween. A silicon dioxide layer 60 overlies the island 42 and an N+ doped polycrystalline silicon line 62 overlies the silicon dioxide layer 60 over the universal crossunder 58.

The universal crossunders 48, 58 each comprise an N type region 64 which overlies a P type region 66. Accordingly, a conductive path is created between the P+ regions 44 and 46 through the P type lower portion 66 of the universal crossunder 48. Similarly, a conductive path between the N+ regions 54, 56 is created through the N type upper portion 64 of the universal crossunder 58. The universal crossunders 48, 58 are, accordingly, "universal" in that they may be used to connect either two N+ regions or two P+ regions.

In order to construct the universal crossunders 48 and 58 of the preferred embodiment of the present invention, a slow diffusing N type dopant and a fast diffusing P type dopant are both implanted to approximately the same total dose through a common mask opening. Following the ion implantation, the dopants are diffused, and they are separated into N and P type layers 64, 66 which are parallel to the surface of the substrate 38 due to their differing diffusion rates.

In a typical example, arsenic is used as the N type dopant and boron is used as the P type dopant. Both dopants are implanted to a dosage of about $2\times10^{14}$ atoms/cm$^2$ through the oxide layers 50, 60. That doping will result in an ohmic conductor having a sheet resistance low enough to be effectively independent of MOS action. A sheet resistance of less than about 1000 ohms/square, corresponding to an impurity concentration of about $10^{18}$ atoms/cm$^3$ is considered to be the maximum sheet resistance which is useful to make a conductor ohmic and effectively independent of MOS action. The silicon epitaxial islands 40, 42 typically have a thickness on the order of 6000 Å. Following the ion implantation, the remaining steps in the processing of the integrated circuit 100 are equivalent to a 50 minute diffusion at 1050° C. The effect of that diffusion is the creation of the N region 64 over the P region 66 to create the universal crossunders 48, 58.

While the conductivity of the P+ and N+ paths in the crossunders 48, 58 is less than could be obtained from isolated P and N type diffusions, such as regions 22, 32 of FIG. 1, adequately conductive paths are provided by the universal crossunders 48, 58.

While the invention has been reduced to practice with equal implantation dosages for the boron and arsenic, the relative implant dosages of the boron and arsenic can be optimized in order that there will be a conductivity efficiency of approximately 40% for both paths. With the equal implantation dosages heretofore used, the efficiency of the N type arsenic implant path 64 of the universal crossunder 58 has been approximately 55% of that of a single N type region, such as region 32 of FIG. 1. Similarly, the P type boron implant 66 of the crossunder 48 has had an efficiency of about 33% of the efficiency of the single P type region 22 of FIG. 1.

Referring now to FIGS. 3 and 4, the effects of ion implanting boron and arsenic at implantation energies of about 150 KeV to total dosages of $2\times10^{14}$ atoms/cm$^2$ of each dopant followed by a diffusion of 50 minutes at 1050° C. is shown. In FIG. 3, the physical appearance of a universal crossunder 70 during manufacture of a device is shown. The crossunder 70 is formed by ion implanting boron and arsenic (as shown by the arrows in FIG. 3) through a silicon dioxide layer 72 having a thickness of about 1000 Å. The ion implantation is masked by a defined photoresist layer 74. At this point in the processing the drains and sources have not yet been formed.

Following the diffusion of the implanted ions, the crossunder 70 would have an N type layer 76 which is relatively shallow and an underlying P type layer 78 which extends down to the sapphire substrate 80 in the N— — layer 82 if no drains or sources (as shown in FIG. 2) were formed. As a result of the diffusion, the P type boron ions tend to diffuse both deeper and over a wider area than the N type arsenic ions. In actual practice the regions on either side of the crossunder 70, which the crossunder 70 is designed to interconnect, would be doped either to N+ or P+ conductivity and the resulting structure, after diffusion, would look like one of the structures shown in FIG. 2, i.e. the N region 76 would not be isolated by the P region 78 from the adjacent regions.

Referring now to FIG. 4, the results of the diffusion of the ions in forming the universal crossunder 70 of FIG. 3 are shown graphically. In particular, the concentration of arsenic ions is substantially greater than the concentration of boron ions near the surface of the epitaxial silicon layer. Similarly, the concentration of boron ions exceeds the concentration of arsenic ions at a depth of approximately 2000 Å, and remains higher than the concentration of arsenic ions down to the surface of the sapphire substrate.

The experimental results obtained by the inventor compare well to calculated values of resistance for a crossunder having a width of about 10 microns. In particular, the n type path has a measured resistance of 600 ohms/square as compared to a calculated resistance of 780 ohms/square, and the P type path has a measured resistance of about 200 ohms/square as compared to a calculated resistance of 220 ohms/square.

It should be noted that the utility of the universal crossunders described herein is greatest in applications in which a semiconducting body overlies an insulating substrate. Accordingly, the CMOS/SOS technology is a perfect application for the universal crossunders, although it may be used in some bulk silicon processes, i.e. where one of the diffusions to be connected is at the power supply potential.

What is claimed is:

1. An integrated circuit including a universal crossunder comprising:
   (a) a substrate of an insulating material;
   (b) at least two islands of a layer of single crystal semiconductor material disposed on said substrate;
   (c) each of said islands including therein a pair of separate spaced regions of the same conductivity type with the regions on one of said islands being of one conductivity type and the regions in the other island being of the opposite conductivity type,
   (d) a portion of the semiconductor layer lying between said pair of spaced regions in each island, said portion being comprised of a first layer of one conductivity type and a second layer overlying said first layer, said second layer being opposite in conductivity type to said first layer, each of said layers having an impurity concentration of at least $10^{18}$ atoms/cm$^3$, and each of said layers contacting each of said spaced regions whereby one of said layers of said portion ohmically connects said pair of spaced regions together; and
   (e) a conductive gate line extending over and insulated from the portion of each of said islands.

2. The integrated circuit of claim 1 wherein said layer of semiconductor material is an epitaxial layer formed on said insulating substrate.

3. The integrated circuit of claim 1 wherein said insulating substrate is comprised of sapphire and said semiconductor material is comprised of silicon.

4. The integrated circuit of claim 3 wherein said first layer is P type and said second layer is N type.

5. The integrated circuit of claim 4 wherein said first layer is doped with a P type dopant having a diffusion coefficient substantially greater than the diffusion coefficient of said N type dopant.

6. The integrated circuit of claim 5 wherein said P type dopant is boron and wherein said N type dopant is arsenic.

* * * * *